May 2, 1972 R. E. JOHNSON ET AL 3,660,312
METHOD OF MAKING DOPED GROUP III-V COMPOUND SEMICONDUCTOR MATERIAL
Filed March 21, 1960
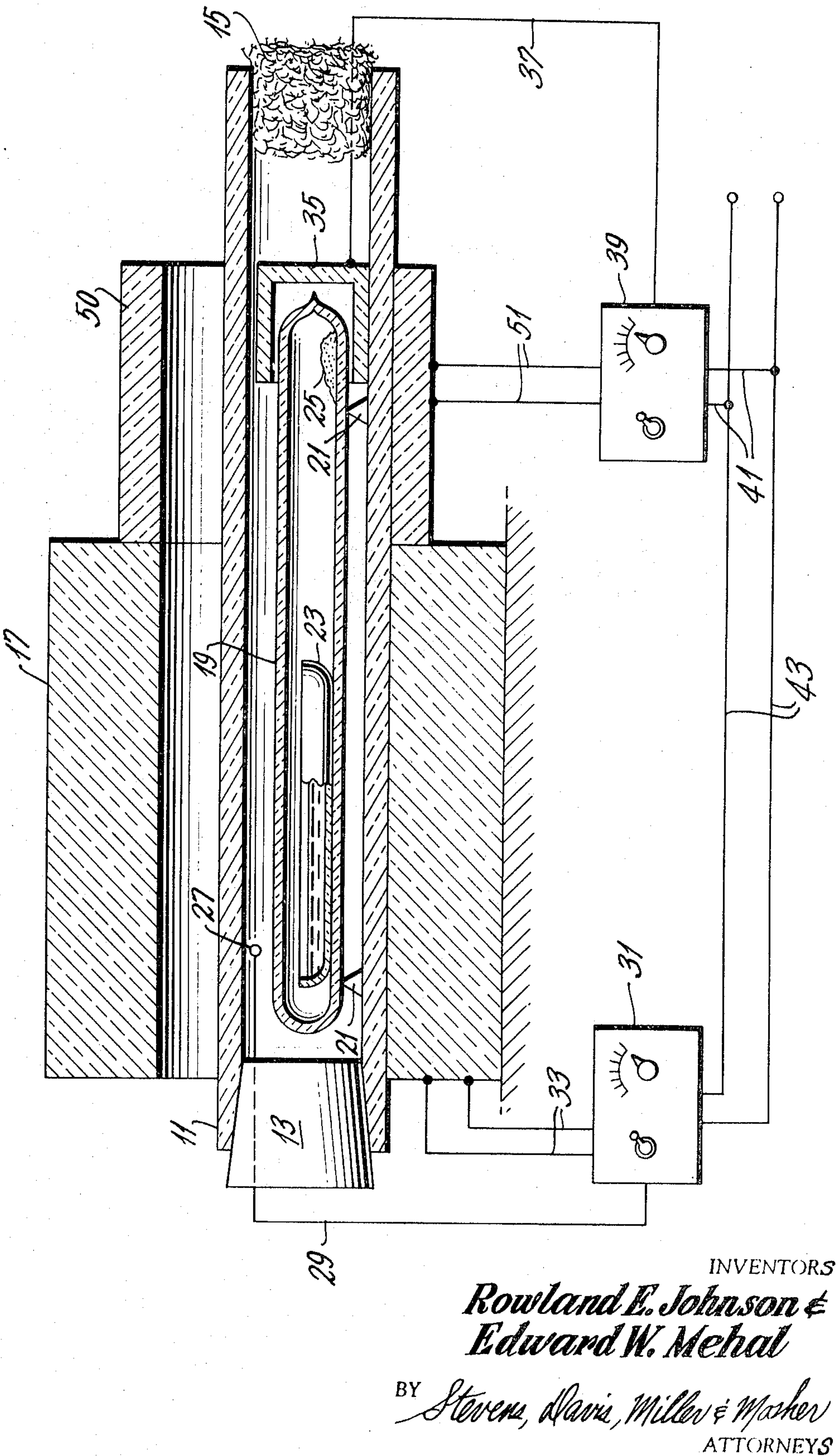
INVENTORS
Rowland E. Johnson & Edward W. Mehal
BY Stevens, Davis, Miller & Mosher
ATTORNEYS 3,660,312

METHOD OF MAKING DOPED GROUP III–V COMPOUND SEMICONDUCTOR MATERIAL

Rowland E. Johnson and Edward W. Mehal, Dallas, Tex., assignors to Texas Instruments Incorporated, Dallas, Tex.

Filed Mar. 21, 1960, Ser. No. 16,572
Int. Cl. H01b *1/06;* H01l *3/20*
U.S. Cl. 252—518 4 Claims

ABSTRACT OF THE DISCLOSURE

Method of making Group III–V compound semiconductor having the requisite impurity level for direct fabrication into tunnel diodes. In a reaction chamber, a high temperature zone containing a mixture of first element (e.g. gallium) and excess doping agent (e.g. zinc), and a low temperature zone containing excess second element (e.g. arsenic) are provided. The heating temperatures in the zones are controlled so that sufficient second element is vaporized and enough mixture of first element and doping agent are maintained above the melting point of the compound to assure reaction to give a stoichiometric melt of compound. A temperature gradient is established through said melt, and the temperature of the high temperature zone is lowered while maintaining said temperature gradient to freeze said melt progressively from one end.

This invention relates to semiconductor materials and more particularly to a method for producing highly doped compound semiconductor material suitable for use in "tunnel" diodes and to the improved devices made from such material.

Semiconductor materials have come into prominence recently because of their usefulness in making such devices as transistors, diodes, rectifiers, photoelectric devices, and thermoelectric devices among others.

Certain elements of Group IV of the periodic table of elements, i.e., carbon, silicon, germanium and tin, have in common the characteristics requisite for semiconductor materials. (As used herein, the periodic table of elements shall mean that table according to Mendelejeff, as now generally portrayed.) However, because of the difficulty of synthetic production of the diamond form of carbon and the instability of the diamond lattice in tin, the semiconductor materials first used, and now most commonly used, in devices of the type mentioned above are germanium and silicon.

Nevertheless, because of certain inherent limitations of germanium and silicon as semiconductor materials and because of the difficulties of producing and maintaining the diamond lattice structure in tin and carbon, experimenters have been diligently searching for other and better semiconductor materials. The so-called compound semiconductor materials which may be comprised, for example, of an element from Group III and an element from Group V of the periodic table, as disclosed in U.S. Pat. No. 2,798,989 to Welker, appear superior to the Group IV semiconductors in many of their characteristics.

Despite the inherent advantages of the compound semiconductors, certain difficulties have prevented their use in semiconductor devices to any important degree, as yet. Among these are the difficulties of producing a material of the requisite purity required for the starting material used in device fabrication. Added to this are the difficulties of adding required amounts of significant impurities or "dopes" to the pure material to produce the p- and n-type regions required in useful devices.

These difficulties have become especially troublesome in connection with the attempts to use the III–V compound semiconductor materials in devices requiring a relatively extremely high level of doping in the semiconductor material. A typical device requiring such high doping levels is the recently developed tunnel diode.

The tunnel diode is a crystal semiconductor device having a single, very sharp p-n junction with the material on either side of the junction "doped" to degeneracy, i.e., containing relatively large amouts of donor or acceptor impurities. The tunnel diode exhibits a current-voltage characteristic with a negative resistance region which is quite large, and thus is useful as an oscillator and as an amplifier.

Primarily, it has been attempted to produce in bodies of compound semiconductor material the doping levels required for tunnel diodes by solid state diffusion. By this method, a small slab of extremely pure compound semiconductor material was placed in a closed evacuated chamber, together with an amount of a suitable doping material. (Suitable doping materials for III–V compound semiconductor materials are generally the elements of Group II for acceptors and the elements of Group VI for donors.) The chamber and its contents were then heated to a temperature slightly below the melting point of the semiconductor material, but sufficient to produce an atmosphere of the impurity vapor. The chamber was held at that temperature until enough of the impurity diffused into the semiconductor material to produce the required level of doping throughout the slab. This procedure usually required several days using temperatures of up to 1000° C. Further, after the diffusion process, it was necessary to lap, etch and clean the surface of the slab before it could be fabricated into a tunnel diode by alloying to the slab a small amount of opposite-type impurity to produce the other highly doped region and sharp p-n junction. In addition to the time element involved, other difficulties were present because of the extremely high vapor pressures produced by some impurities and the tendency of the semiconductor material to dissociate at the diffusion temperatures. By the present invention, the problems mentioned above are obviated by providing a method of forming the compound semiconductor material containing, when formed, the level of doping of one-type impurity requisite for tunnel diodes and other devices without the necessity of resorting to the solid state diffusion of the prior art.

Therefore, it is one object of the present invention to provide a method to form compound semiconductor material containing a high level of doping impurities.

Another object of the present invention is to provide a method of forming a compound semiconductor which is doped to a level of degeneracy.

Still another object of the present invention is to provide a method of producing a doped compound semiconductor ingot from which varies semiconductor devices, and especially tunnel diodes, can be formed directly without resorting to crystal growing processes.

A further object of the present invention is to provide a method of growing large crystal, compound semiconductors from a stoichiometric melt such that the compound semiconductor is doped to degeneracy.

A still further object of the present invention is to provide a method for forming a compound semiconductor material containing impurity levels approaching the maximum solubility limit of that impurity in the solid compound semiconductor.

A still further object of the present invention is to provide a method of forming compound semiconductor material having the requisite impurity level required for direct fabrication into tunnel diodes.

Other objects and advantages of this invention will become apparent as the following description proceeds, which description should be taken together with the accompanying drawing in which the single figure is a sectional view of apparatus for producing semiconductor material in accordance with the principles of this invention.

The present invention will be disclosed with specific reference to gallium arsenide as the compound semiconductor material. The principles involved may readily be seen to be applicable to other binary compound semiconductors such as, for example, indium phosphide, gallium phosphide, indium antimonide, gallium antimonide, and others, as well as to three or more element compound semiconductors. The apparatus shown in the drawing illustrates one manner in which highly doped ($10^{20}$ carriers per cc.) material may be formed. This apparatus comprises a ceramic tube 11, of generally cylindrical form, which may be closed at one end by a suitable plug 13 and at the other end by a plug 15 of quartz or glass wool to prevent cool air currents through the tube. The tube 11 is partially situated within a furnace 17 of ceramic, metal, or other such material. A second furnace 50 surrounds another portion of the tube 11, as shown. Within the tube 11 is a sealed quartz reaction chamber 19 resting upon supports 21 within the tube 11. The sealed chamber 19 contains at one end, well within the furnace 17, a quartz boat 23, and at its other end, which is exterior to the furnace 17 but within the furnace 50, a quantity of the more volatile element of the compound semiconductor to be formed which, in the case of gallium arsenide, is arsenic. A thermocouple 27, connected by a wire 29 to a temperature control 31, is mounted within the tube 11, and controls the temperature at one end of the furnace 17 through control of the power delivered to the furnace through wires 33. A support 35 surrounding the other end of the sealed chamber 19 contains a second thermocouple which is connected by means of a wire 37 to a second temperature control 39 to control the temperature of the second furnace 50 through control of the power delivered to the furnace 50 through wires 51. Wires 43 and wires 41 serve the furnaces and the temperature controls with electrical energy.

The boat 23 within one end of the sealed chamber 19 contains an amount of one element of the compound semiconductor and an "excess" amount of the doping agent. By an "excess" amount of doping agent is meant that amount of the agent required to exceed the solubility limit of the particular doping agent in the total amount of solid compound semiconductor material which will be formed within the boat 23. The material 25 at the other end of the sealed chamber 19 is the more volatile element of the compound semiconductor to be formed. By way of illustration, the boat 23 may contain a mixture of gallium and tellurium or gallium and zinc, and the material 25 may be arsenic or phosphorus. The temperature control 31 is adjusted to maintain a temperature of the boat 23 above the melting point of the compound semiconductor material to be formed. In the case of gallium arsenide, the melting point is approximately 1234° C. The furnace 17 is so constructed that a 20–45° C. temperature gradient from one end to the other of boat 23 is maintained. Such a temperature gradient may be achieved through proper placement of the heating coils of the furnace, or by other known means. The hotter end of the boat 23 may be maintained at approximately 1260–1265° C. for the case of gallium arsenide. The end of the sealed chamber 19 containing the material 25 should be maintained at the temperature at which the vapor pressure of the material 25 is correct to produce a stoichiometric melt of the compound semiconductor in the boat 23 from which an ingot is to be grown. For gallium arsenide, the arsenic should be maintained at a temperature of 607° C. In this manner, the temperature at the cool end of the chamber 19 is sufficient to volatilize the material 25 which is contained therein, and the temperature at the hot end of the chamber 19 containing the boat 23 is sufficient to maintain the contents of the boat above the melting temperature of the compound semiconductor material to be formed. At these temperatures, the volatilizing material 25 forms an atmosphere within the chamber 19, and combines with the element in the boat 23 to produce a stoichiometric molten compound semiconductor material containing an "excess" of doping agent.

After maintaining the molten material under the conditions outlined above for a period of time sufficient for the stoichiometric compound to form, which may be about five hours, the melt is subjected to gradient freezing by gradually reducing the temperature in the furnace 17 over a period of from four to eight hours while maintaining substantially constant the temperature gradient of about 20–45° C. across the boat 23. In this manner, the compound semiconductor material begins freezing at the cooler end of the boat 23, and progressively freezes until the temperature at the hotter end of the boat 23 falls below the melting temperature of the compound semiconductor material (about 1234° C. for gallium arsenide). Due to the segregation characteristics of the dope in the freezing material, the "excess" doping material will be swept by the advancing freezing interface of the crystalline mass to the last frozen end of the compound semiconductor material, providing a supersaturated portion of material at the finally frozen end of the crystalline mass.

The frozen mass will usually be polycrystalline. However, when slowly cooled as described, the individual crystals in the mass will be quite large and, on occasion, the mass will seed itself and freeze as a single crystal. Alternatively, the molten mass can be seeded to cause a single crystal to grow during cooling.

By this method, there is formed a crystalline mass of highly doped semiconductor material. Although the mass is polycrystalline, the individual crystals of the material are so large that slices of the material, as formed, are suitable for fabrication directly into devices such as tunnel diodes. After the formation of the crystalline mass itself, the first frozen end, in which the individual crystals are too small, and the last frozen end, which is supersaturated with the doping material, may be cut off to leave the more desirable middle portion. This middle portion is then sliced and diced into wafers, which are then suitably etched and polished preparatory to producing devices. After preparation of the wafers, suitable contacts are attached to the wafer, one ohmic and one rectifying. Leads are then attached to the contacts, and the device is encapsulated to provide a finished product.

Gallium arsenside is an excellent example of a compound semiconductor material which can be formed taking advantage of the improved process above described, because gallium arsenide presents some of the greatest problems in doping to high levels. The arsenic is somewhat volatile, and, if it is attempted to dope a preformed slab of high purity gallium arsenide to degeneracy with zinc, tellurium, or other such materials, the gallium arsenide tends to decompose by the dissociation of the arsenic from the gallium over the long period of time required for such diffusion. The method of producing highly doped material by this invention has proved extremely useful not only with arsenic compound semiconductors, but also with the phosphorus compound semiconductors and with others in which one of the elements has a higher vapor pressure than the other.

There now follow specific examples of the method and articles of the present invention.

EXAMPLE I

Using the apparatus shown in the drawing, 25 grams of 99.9999% pure gallium and 1 gram of 99.95% pure zinc were placed into the boat 23, and 40 grams of 99.9995% pure arsenic were placed at the right end of sealed chamber 19. The boat 23 was placed toward the left end of chamber 19. The chamber 19 was then evacuated, sealed, and arranged in tube 11 and the gradient freeze furnace and the vapor pressure control furnace 50, as shown in the drawing. The end of the sealed chamber containing the boat 23 was heated to 1245° C.–1290° C. to establish a 45° C. gradient along the boat 23. The other end of the chamber 19 was heated to an arsenic control temperature of 607° C. The temperature conditions were held for a period of five hours, during which time molten stoichiometric gallium arsenide containing dissolved zinc formed in boat 23. The gallium arsenide was then frozen (by slowly lowering the power to furnace 17) over an eight hour period, all the while preserving the temperature gradient along the boat 23. Next, the boat 23 was cooled to 600° C. over a four-hour period and then the chamber 19 containing boat 23 was removed from the furnace and cooled to room temperature. After removing the gallium arsenide ingot from the sealed chamber 19 and boat 23, it was evaluated by preparing diodes therefrom by slicing and dicing the material, lapping and etching the dice, and alloying a tin dot to one side of each die to form a rectifying contact and soldering (with zinc-doped gold) a copper ohmic contact tab to the other side of the die. The diodes were found to possess the characteristics of excellent tunnel diodes, and to be suitable for such use. A determination of the carrier density of the material showed the material to possess about $10^{20}$ carriers per cubic centimeter.

EXAMPLE II

Using the same procedure and equipment as in Example I, 25 grams of 99.95% gallium and 1 gram of 99.95% pure zinc were placed in boat 23. 40 grams of 99.9995% pure arsenic were placed at the right end of the sealed chamber 19. An arsenic control temperature of 607° C. was used. Diodes prepared from the resulting gallium arsenide material in the same manner as described in Example I were tested and proved to be suitable for use as tunnel diodes. The carrier density of the material was about $10^{20}$ carriers per cubic centimeter.

EXAMPLE III

The same procedure and equipment were used as in Example I. 140 grams of 99.9995% pure gallium and 6 grams of 99.95% pure zinc were placed in boat 23 and 165 grams of 99.9995% pure arsenic were placed at the right end of the chamber 19. An arsenic control temperature of 607° C. was used. Diodes prepared as noted above from the resulting gallium arsenide material were tested and proved suitable for use as tunnel diodes. The material was shown to have a carrier density of about $1.08\times10^{20}$ carriers per cubic centimeter.

EXAMPLE IV

Using the apparatus shown in the drawing, 25 grams of 99.9999% pure gallium and 1 gram of 99.999% pure tellurium were placed into the boat 23, and 40 grams of 99.9995% pure arsenic were placed at the right end of chamber 19. The chamber 19 was then evacuated, sealed, and arranged in tube 11 and the gradient freeze furnace, as shown in the drawing. The end of the sealed chamber 19 with the boat 23 thereat was heated to 1245° C.–1290° C. to establish a 45° C. gradient across the boat 23. The other end of the chamber 19 was heated to an arsenic control temperature of 605° C. The temperature conditions were held for a period of five hours during which time a stoichiometric melt of gallium arsenide containing dissolved tellurium formed in boat 23. The gallium arsenide was then frozen over an eight-hour period, all the while preserving the gradient across the boat. Next, the boat 23 was cooled to 600° C. over a four-hour period, and then the chamber 19 containing boat 23 was removed from the furnace and cooled to room temperature. After removing gallium arsenide from the chamber 19 and boat 23, it was evaluated by preparing diodes as before, except using zinc-doped tin for the rectifying, and gold-tin solder for the ohmic contact, since the gallium arsenide die was of strongly n-type conductivity. The diodes were found to possess the characteristics of tunnel diodes and to be suitable for such use, although not as suitable as those of previous examples. A determination of the carrier density of the material showed the material to possess about $5\times10^{19}$ carriers per cubic centimeter. Tested at 300° Kelvin, the material had a mobility of about 500 cm.$^2$ per volt-second and a resistivity of $8.2\times10^{-4}$ ohm-cm.

EXAMPLE V

Using the same procedure and equipment as Example I, 25 grams of 99.9999% pure gallium and 1 gram of 99.999% pure selenium were placed in boat 23. 40 grams of 99.9995% pure arsenic were placed at the right end of the chamber 19. An arsenic control temperature of 605° C. was used. Diodes prepared as above from the resulting gallium arsenide material were tested and proved to be suitable for use as tunnel diodes of about the same quality as the diodes of Example IV. The carrier density of the material was about $1.56\times10^{19}$ carriers per cubic centimeter. Tested at 300° Kelvin, the material had a mobility of 1049 cm.$^2$ per volt-second and a resistivity of $6.10\times10^{-4}$ ohm-cm.

EXAMPLE VI

The same procedure and equipment were used as in Example I. 150 grams of 99.999% pure gallium and 6 grams of 99.9999% pure tellurium were placed in boat 23, and 175 grams of 99.995% pure arsenic were placed at the right end of the chamber 19. An arsenic control temperature of 605° C. was used. Diodes prepared as noted above from the resulting gallium arsenide material were tested and proved suitable for use as tunnel diodes of about the same quality as those of the previous example.

EXAMPLE VII

Using the same procedure and equipment as Example I, 150 grams of 99.9999% pure gallium and 5 grams of 99.999% pure selenium were placed in boat 23. 175 grams of 99.995% pure arsenic were placed at the right end of the chamber 19. An arsenic control temperature of 605° C. was used. Diodes prepared as noted above from the resulting gallium arsenide material were tested and proved to be suitable for use as tunnel diodes of about the same quality as those of the next preceding example. The carrier density of the material was about $1.084\times10^{19}$ carriers per cubic centimeter. Tested at 300° Kelvin, the material had a mobility of 1106 cm.$^2$ per volt-second and a resistivity of $6.15\times10^{-4}$ ohm-cm.

EXAMPLE VIII

Using the same procedure and equipment as Example I, 25 grams of 99.9999% pure gallium, 1 gram of 99.999% pure tellurium, and 1 gram of 99.999% pure selenium were placed in boat 23. 40 grams of 99.995% pure arsenic were placed at the right end of the chamber 19. An arsenic control temperature of 605° C. was used. Diodes prepared as above from the resulting gallium arsenide material were tested and proved to be suitable for use as tunnel diodes of about the same quality as the diodes of Example VII. The carrier density of the material was about $8.9\times10^{18}$ carriers per cubic centimeter.

This specification has described a new and improved diode, diode material, and method and apparatus for producing such diodes. It is realized that study of this description will suggest to others skilled in the art new and other manners of using the principles thereof without departing from the spirit of this invention. It is, therefore, intended that this invention be limited only by the scope of the appended claims.

What is claimed is:

1. The method of making a Group III–V compound semiconductor having a degenerate conductivity determining impurity level therein formed of a first element and a second more volatile element, said method comprising the steps of providing a reaction chamber having at least a high temperature zone and a low temperature zone, heating in said high temperature zone a mixture of said first element and a doping agent effective to produce the degenerate conductivity determining impurity level in said compound semiconductor, said doping agent being provided in excess, providing in said low temperature zone an amount of said second element greater than that amount required to form a stoichiometric molten compound with said first element, controlling the temperature in said low temperature zone such that at least a portion of said second element vaporizes producing the vapor pressure of said second element in said reaction chamber required for stoichiometric combination with said first element, controlling the temperature in said high temperature zone such that said first element and doping agent mixture are maintained above the melting temperature of said compound for a time sufficient to assure reaction between said first and said second elements to form a stoichiometric melt of said compound, establishing a temperature gradient through said melt, lowering the temperature of said high temperature zone while maintaining said temperature gradient to freeze said melt progressively from one end.

2. The method of claim 1 wherein said first element is gallium, said second element is arsenic and said doping agent is zinc.

3. The method of claim 2 wherein said temperature gradient is from 20° C. to 45° C.

4. The method of making a Group III–V compound semiconductor, doped to a high level, formed of a first element and a second more volatile element, said method comprising providing an evacuated reaction chamber having a high temperature zone and low temperature zone, heating and melting in said high temperature zone a mixture of said first element and a doping agent in an amount effective to produce the desired level of impurity concentration, heating and vaporizing in said low temperature zone, an amount of said second element sufficient to maintain the vapor pressure of said second element at the decomposition vapor pressure of said compound semiconductor at its melting point, reacting the vaporized second element with said first element and doping agent to form a melt of said compound semiconductor while controlling the temperature in said low temperature zone in order to maintain the said vapor pressure of said second element, establishing a temperature gradient through said melt and lowering the temperature of said high temperature zone containing the melt at a slow and uniform rate to effect gradient crystallization.

References Cited

UNITED STATES PATENTS

| | | | |
|---|---|---|---|
| 2,871,100 | 1/1959 | Guire et al. | 23—204 |
| 2,921,905 | 1/1960 | Hung-Chi Chang | 23—204 |
| 2,798,989 | 7/1957 | Welker | 23—204 |

RICHARD D. LOVERING, Primary Examiner

U.S. Cl. X.R.

23—204 R; 252—62.3 GA, 62.3 T, 516, 520